(12) United States Patent
Kurita et al.

(10) Patent No.: US 11,239,145 B2
(45) Date of Patent: Feb. 1, 2022

(54) ELECTRONIC COMPONENT MODULE

(71) Applicant: KABUSHIKI KAISHA TOSHIBA, Tokyo (JP)

(72) Inventors: Yoichiro Kurita, Tokyo (JP); Hideto Furuyama, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 16/808,522

(22) Filed: Mar. 4, 2020

(65) Prior Publication Data

US 2021/0035900 A1 Feb. 4, 2021

(30) Foreign Application Priority Data

Jul. 31, 2019 (JP) .............................. JP2019-140663

(51) Int. Cl.
*H01L 23/52* (2006.01)
*H01L 23/498* (2006.01)
*H01L 23/00* (2006.01)
*H01L 23/32* (2006.01)

(52) U.S. Cl.
CPC ........ *H01L 23/49838* (2013.01); *H01L 24/32* (2013.01); *H01L 23/32* (2013.01); *H01L 2224/26165* (2013.01); *H01L 2224/32227* (2013.01)

(58) Field of Classification Search
CPC ... H01L 23/49838; H01L 23/32; H01L 24/32; H01L 2224/32227; H01L 2224/26165

USPC ................................................. 257/778, 782
See application file for complete search history.

(56) References Cited

U.S. PATENT DOCUMENTS

| | | | | |
|---|---|---|---|---|
| 9,137,900 B2* | 9/2015 | Tanaka | ................... | H05K 1/185 |
| 9,831,167 B1* | 11/2017 | Lin | ................... | H01L 21/486 |
| 2011/0240717 A1* | 10/2011 | Song | ................... | H05K 3/303 |
| | | | | 228/180.22 |
| 2018/0286797 A1* | 10/2018 | Goh | ................... | H01L 23/66 |
| 2019/0064214 A1 | 2/2019 | Takahashi et al. | | |

FOREIGN PATENT DOCUMENTS

JP 2019-40688 A 3/2019

* cited by examiner

*Primary Examiner* — Luan C Thai
(74) *Attorney, Agent, or Firm* — Finnegan, Henderson, Farabow, Garrett & Dunner L.L.P.

(57) ABSTRACT

According to one embodiment, the electrode pads are provided at a surface of the substrate. The metal pad is provided at the surface of the substrate. The electronic component is mounted to the surface of the substrate. The electronic component includes a plurality of opposing electrodes. The opposing electrodes oppose the electrode pads in a direction toward the surface direction and are electrically connected to the electrode pads. The positioning component is fixed to the metal pad. A gap between the positioning component and the electronic component in an in-plane direction of the surface of the substrate is shorter than a minimum distance of the electrode pads.

20 Claims, 15 Drawing Sheets

ELECTRONIC COMPONENT MODULE

CROSS-REFERENCE TO RELATED APPLICATION

This application is based upon and claims the benefit of priority from Japanese Patent Application No. 2019-140663, filed on Jul. 31, 2019; the entire contents of which are incorporated herein by reference.

FIELD

Embodiments described herein relate generally to an electronic component module.

BACKGROUND

As the integration density necessary for performance improvement increases in a semiconductor integrated circuit such as LSI or the like, the necessary number of terminals of the package is increasing; the package size is being enlarged; and the terminal pitch is being reduced. For example, a narrow-pitch connection is being performed by fusing micro solder balls.

DETAILED DESCRIPTION

Figure 1:
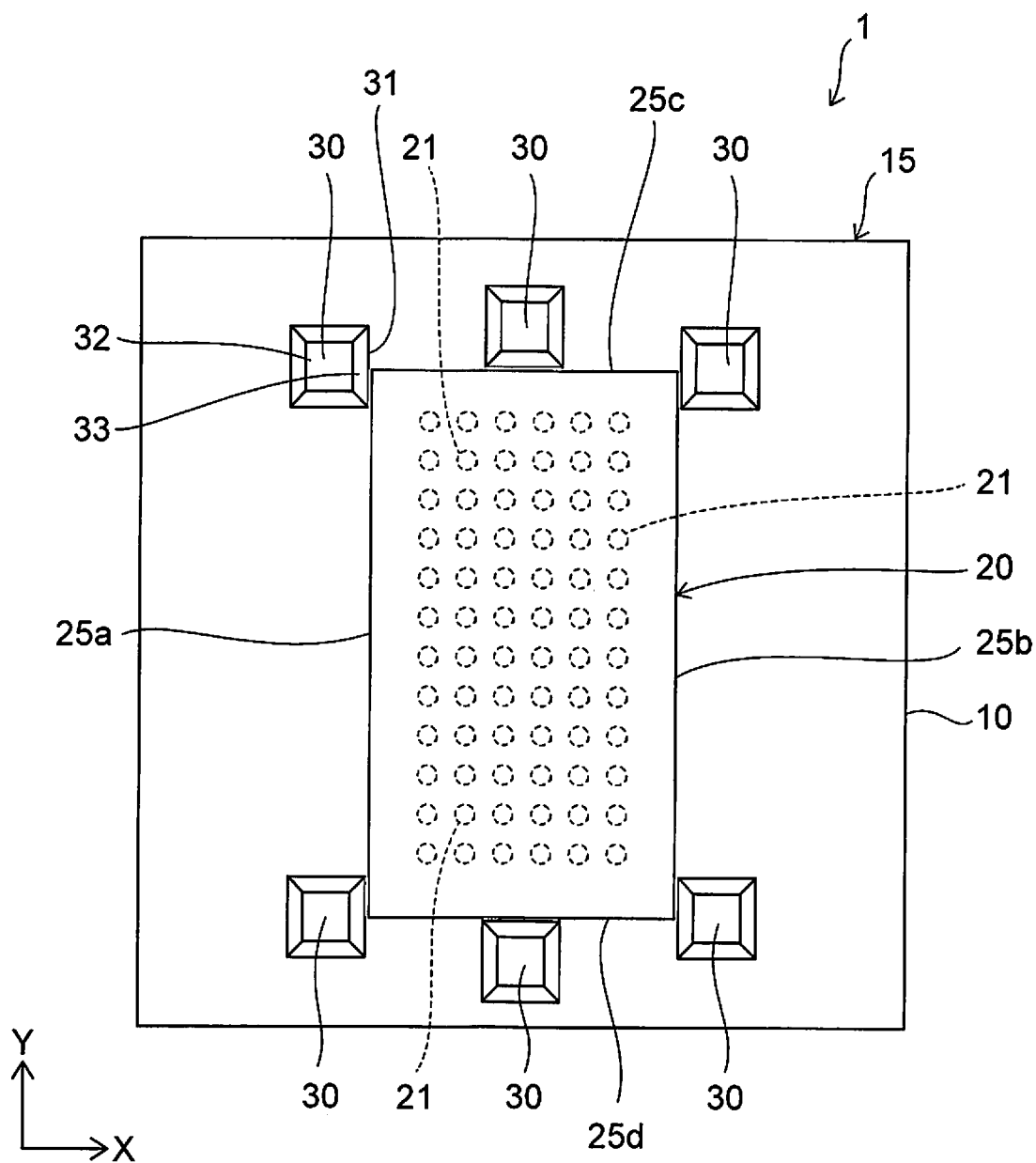
FIG. 1 is a schematic plan view of an electronic component module according to an embodiment.

An embodiment of the invention is directed to provide an electronic component module in which an electronic component can be positioned accurately with respect to electrode pads on a substrate, the electronic component can have a multi-terminal connection using a narrow-pitch electrode array or the like, and the electronic component module is compact and has a simple configuration.

According to one embodiment, an electronic component module includes a substrate, a plurality of electrode pads, at least one metal pad, an electronic component, and at least one positioning component. The electrode pads are provided at a surface of the substrate. The metal pad is provided at the surface of the substrate. The electronic component is mounted to the surface of the substrate. The electronic component includes a plurality of opposing electrodes. The opposing electrodes oppose the electrode pads in a direction toward the surface direction and are electrically connected to the electrode pads. The positioning component is fixed to the metal pad. A gap between the positioning component and the electronic component in an in-plane direction of the surface of the substrate is shorter than a minimum distance of the electrode pads.

Embodiments will now be described with reference to the drawings as appropriate. For convenience of description, the scale in each drawing is not always accurate; and relative positional relationships, etc., may be used. The same or similar components are marked with the same reference numerals.

FIG. 1 is a schematic plan view of an electronic component module 1 according to an embodiment.

Figure 2A:
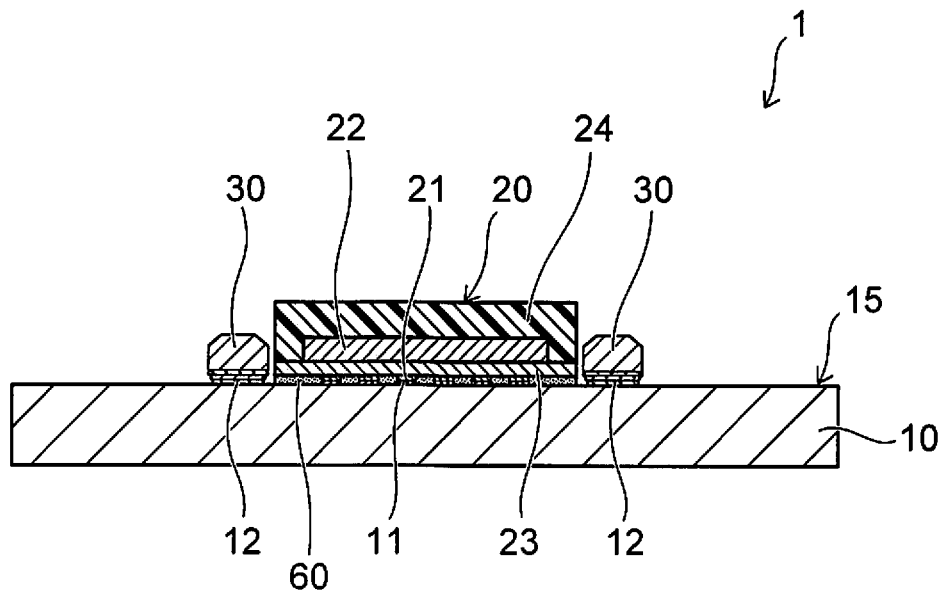
FIG. 2A is a schematic cross-sectional view of the electronic component module according to the embodiment.
Figure 2B:
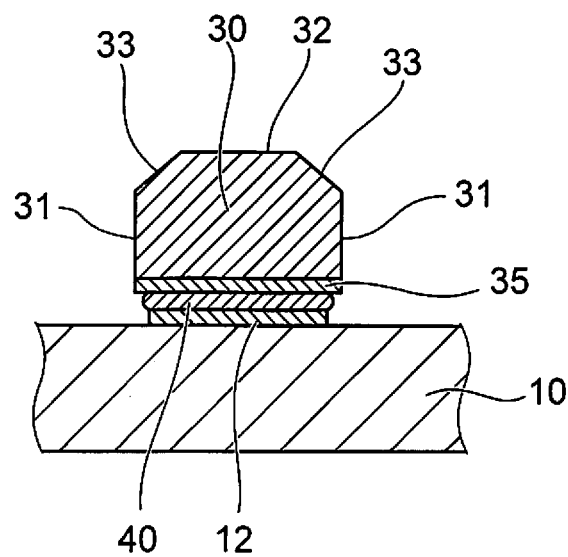
FIG. 2B is an enlarged cross-sectional view of a positioning component shown in FIG. 2A.

FIG. 2A is a schematic cross-sectional view of the electronic component module 1; and FIG. 2B is an enlarged cross-sectional view of a positioning component 30 shown in FIG. 2A.

Figure 3:
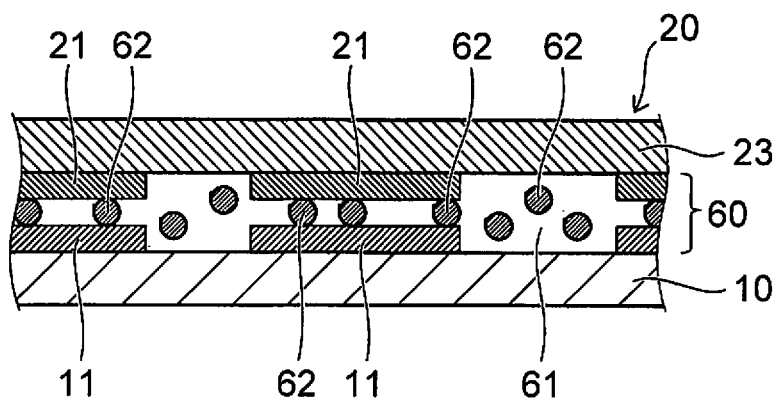
FIG. 3 is a schematic cross-sectional view of the electronic component module according to the embodiment.

FIG. 3 is a schematic cross-sectional view of a connection part between an electronic component 20 and a substrate 10.

The electronic component module 1 includes a substrate module 15, the electronic component 20, and an anisotropic conductive member 60.

Figure 4:
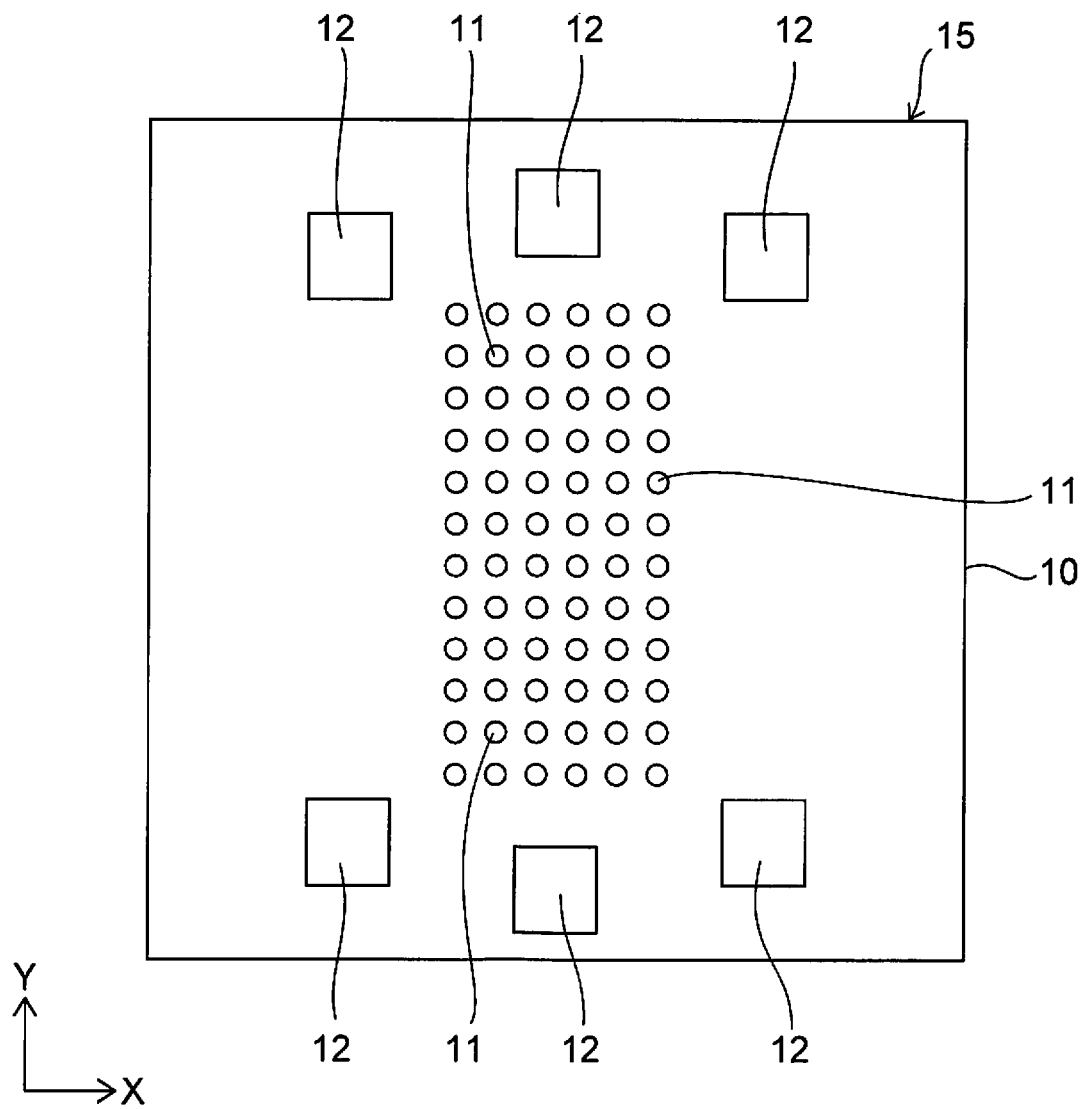
FIG. 4 and FIG. 5 are schematic plan views of a substrate module according to the embodiment.
Figure 5:
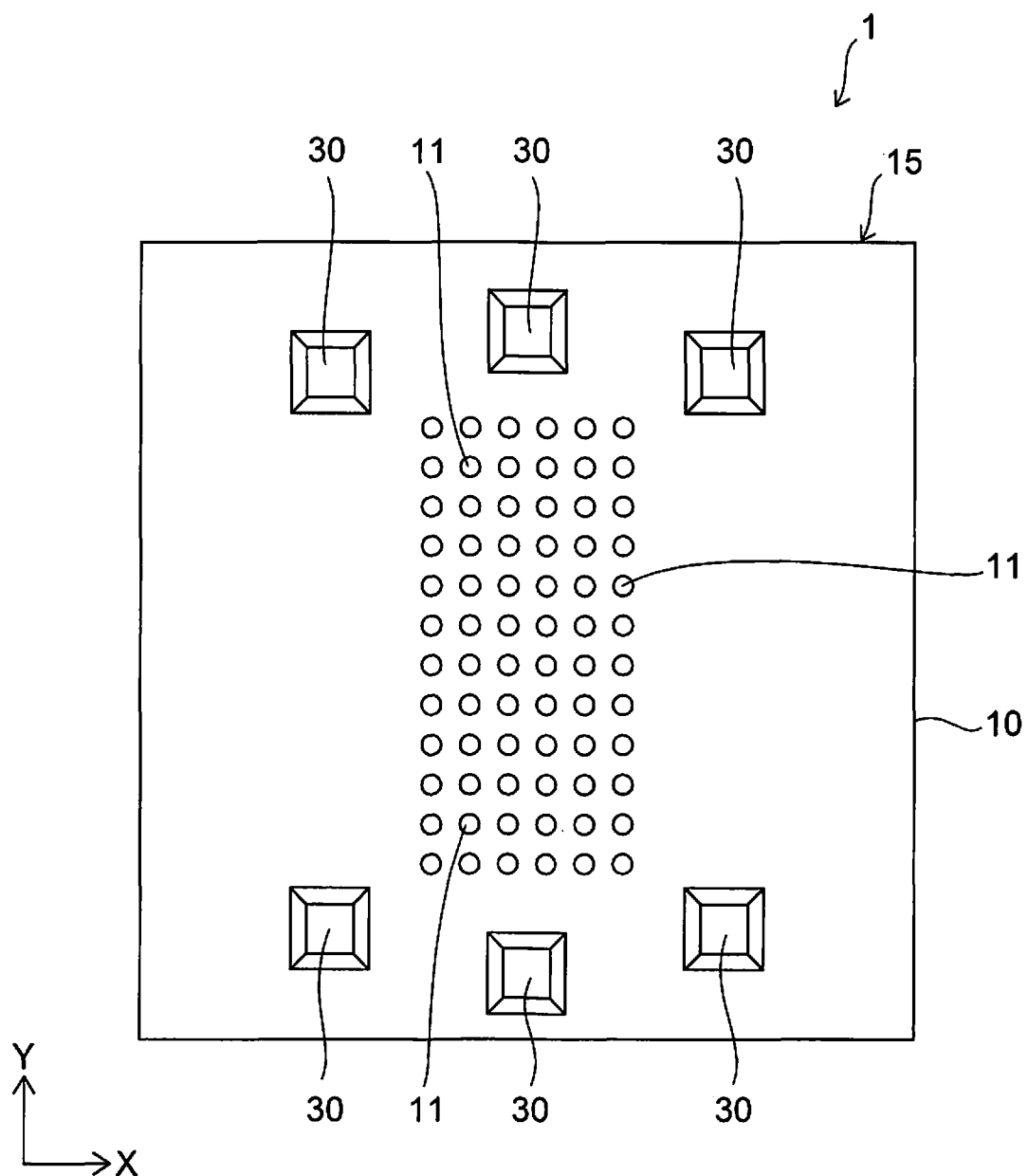

FIG. 4 and FIG. 5 are schematic plan views of the substrate module 15. Two directions orthogonal to each other in a plane parallel to the surface of the substrate 10 are taken as a first direction X and a second direction Y.

The substrate module 15 includes the substrate 10, electrode pads 11, a metal pad 12, and the positioning component 30. FIG. 4 shows the configuration of FIG. 5 without the positioning component 30.

The multiple electrode pads 11 are provided at the surface of the substrate 10. For example, the multiple electrode pads 11 have a lattice arrangement along the first direction X and the second direction Y. In the example, at least three metal pads 12 are provided at the surface of the substrate 10. The electrode pads 11 and the metal pads 12 are provided at the same surface of the substrate 10.

In the example shown in FIG. 4, six metal pads 12 are provided at the surface of the substrate 10. The multiple electrode pads 11 are more numerous than the metal pads 12 and are provided at a higher density than the metal pads 12. The metal pads 12 have an isolated pattern which is not connected to the electrode pads 11 and is not connected to interconnects formed in the substrate 10.

The metal pads 12 may have a configuration limited to the openings shown in FIG. 4 in a solder resist formed at the surface of the substrate 10.

The distance between the electrode pads 11 next to each other in the first direction X, the distance between the electrode pads 11 next to each other in the second direction Y, and the distance between the electrode pads 11 next to each other in a direction oblique to the first direction X and the second direction Y are shorter than the minimum distance between the metal pads 12.

For example, the electrode pads 11 are circular; and the metal pads 12 are quadrilateral. The surface area of one metal pad 12 is greater than the surface area of one electrode pad 11. The width in the first direction X and the width in the second direction Y of the metal pad 12 are larger than the diameter of the electrode pad 11.

For example, the electrode pads 11 and the metal pads 12 are formed simultaneously at the surface of the substrate 10 by patterning a metal, are of the same material, and have the same thickness.

As shown in FIG. 2B and FIG. 5, the positioning components 30 are fixed to the metal pads 12. For example, six positioning components 30 are fixed on the surface of the substrate 10 to correspond to the number of the metal pads 12. The material of the positioning component 30 is, for example, silicon, a ceramic, or glass.

As shown in FIG. 2B, a metal film 35 is provided at the surface of the positioning component 30 facing the metal pad 12. The exterior form of the metal film 35 is the same as that of the metal pad 12 and is, for example, quadrilateral. For example, the metal film 35 is metalized with Ni/Au or the like and is fixed to the metal pad 12 by solder 40.

As shown in FIG. 2A, the electronic component 20 is mounted to the surface of the substrate 10. The electronic component 20 includes a chip 22, an interposer 23, multiple opposing electrodes 21, and a sealing resin 24. The chip 22 is, for example, a semiconductor chip and is mounted on the interposer 23. The sealing resin 24 covers the chip 22.

The multiple opposing electrodes 21 are provided at the surface of the electronic component 20 opposing the surface of the substrate 10. The opposing electrodes 21 oppose the multiple electrode pads 11 in a direction perpendicular to the surface of the substrate 10. For example, the multiple opposing electrodes 21 have a lattice arrangement as shown by the broken lines in FIG. 1 to correspond to the arrangement of the multiple electrode pads 11 provided at the surface of the substrate 10. In the example shown in FIG. 2A, the multiple opposing electrodes 21 are provided at the surface of the interposer 23 on the side opposite to the chip mounting surface.

Interconnects that are electrically connected to the opposing electrodes 21 are formed in the interposer 23; for example, the chip 22 and the interconnects are electrically connected with wires. The electronic component 20 may have a bare chip structure or a chip size package structure. Multiple chips 22 may be stacked on the interposer 23.

The multiple opposing electrodes 21 of the electronic component 20 and the multiple electrode pads 11 provided at the surface of the substrate 10 are electrically connected. The opposing electrodes 21 of the electronic component 20 are not electrically connected to the metal pads 12.

The opposing electrodes 21 of the electronic component 20 are electrically connected to the electrode pads 11 via an anisotropic conductive member.

For example, FIG. 3 is a schematic cross-sectional view of a connection part between the opposing electrodes 21 and the electrode pads 11 via the anisotropic conductive member 60 which is an ACF (Anisotropic Conductive Film).

The anisotropic conductive member 60 is inserted between the multiple opposing electrodes 21 of the electronic component 20 and the multiple electrode pads 11 provided at the surface of the substrate 10. The anisotropic conductive member 60 includes, for example, an insulating member 61 such as a resin or the like, and fine metal particles 62 mixed in the insulating member 61. The opposing electrodes 21 and the electrode pads 11 are electrically connected via the metal particles 62. Conductivity is maintained in the vertical direction connecting the opposing electrodes 21 and the electrode pads 11; and insulative properties are maintained in the lateral direction connecting the opposing electrodes 21 and the electrode pads 11.

If the anisotropic conductive member 60 is cured by heating, the state in which the electronic component 20 is fixed to the substrate 10, i.e., the connection state between the oppsing electrodes 21 and the electrode pads 11, is maintained; and a mechanism that presses the electronic component 20 toward the substrate 10 is unnecessary.

As shown in FIG. 1, the electronic component 20 includes, for example, four side surfaces 25a, 25b, 25c, and 25d. The electronic component 20 has a quadrilateral exterior form formed of the four side surfaces 25a, 25b, 25c, and 25d.

As shown in FIG. 1 and FIG. 2A, the positioning components 30 face the side surfaces 25a, 25b, 25c, and 25d of the electronic component 20 in the state in which the opposing electrodes 21 of the electronic component 20 are electrically connected to the electrode pads 11.

The spacing in the surface in-plane direction (a direction in the XY plane) of the substrate 10 between the side surfaces 25a, 25b, 25c, and 25d of the electronic component 20 and the side surfaces of the positioning components 30 facing the side surfaces 25a, 25b, 25c, and 25d are shorter than the minimum distance between the multiple electrode pads 11. Or, among the multiple positioning components 30 (in the example, six), there may be positioning components 30 having side surfaces that contact the side surfaces 25a, 25b, 25c, and 25d of the electronic component 20 (i.e., the spacing recited above is zero).

The positioning components 30 are provided partially at the periphery of the region of the substrate module 15 shown in FIG. 5 where the electrode pads 11 are formed. The electronic component 20 is mounted to the substrate 10 by inserting from above so that the region where the electrode pads 11 are formed is underneath. At this time, the clearance is ensured between the side surfaces 25a, 25b, 25c, and 25d of the electronic component 20 and the side surfaces of the positioning components 30 so that the positioning components 30 do not obstruct (interfere with) the insertion of the electronic component 20. The clearance is reflected as the spacing recited above between the electronic component 20 and the positioning components 30 after mounting the electronic component 20. Due to a slight misalignment after mounting the electronic component 20, there may be positioning components 30 that contact the side surfaces 25a, 25b, 25c, and 25d of the electronic component 20.

As shown in FIG. 2B, the positioning component 30 has a side surface 31 facing the electronic component 20, an upper surface 32, and an oblique surface 33 which is provided between the side surface 31 and the upper surface 32 and is oblique to the side surface 31 and the upper surface 32. Due to the oblique surface 33, the electronic component 20 that is inserted from above the mounting region does not collide with the upper surface of the positioning component 30 easily; and a smooth insertion of the electronic component 20 is possible.

The positioning components 30 restrict the movement (also including the rotation) in directions parallel to the surface of the substrate 10 of the electronic component 20 mounted in the region where the electrode pads 11 are formed, and position the electronic component 20 accurately on the substrate 10.

The positioning component 30 that is provided to face the side surface 25a of the electronic component 20 restricts the movement of the electronic component 20 in the left direction of FIG. 1 along the first direction X. The positioning component 30 that is provided to face the side surface 25b of the electronic component 20 restricts the movement of the electronic component 20 in the right direction of FIG. 1 along the first direction X.

The positioning component 30 that is provided to face the side surface 25c of the electronic component 20 restricts the movement of the electronic component 20 in the upward direction of FIG. 1 along the second direction Y. The positioning component 30 that is provided to face the side surface 25*d* of the electronic component 20 restricts the movement of the electronic component 20 in the downward direction of FIG. 1 along the second direction Y.

Figure 6:
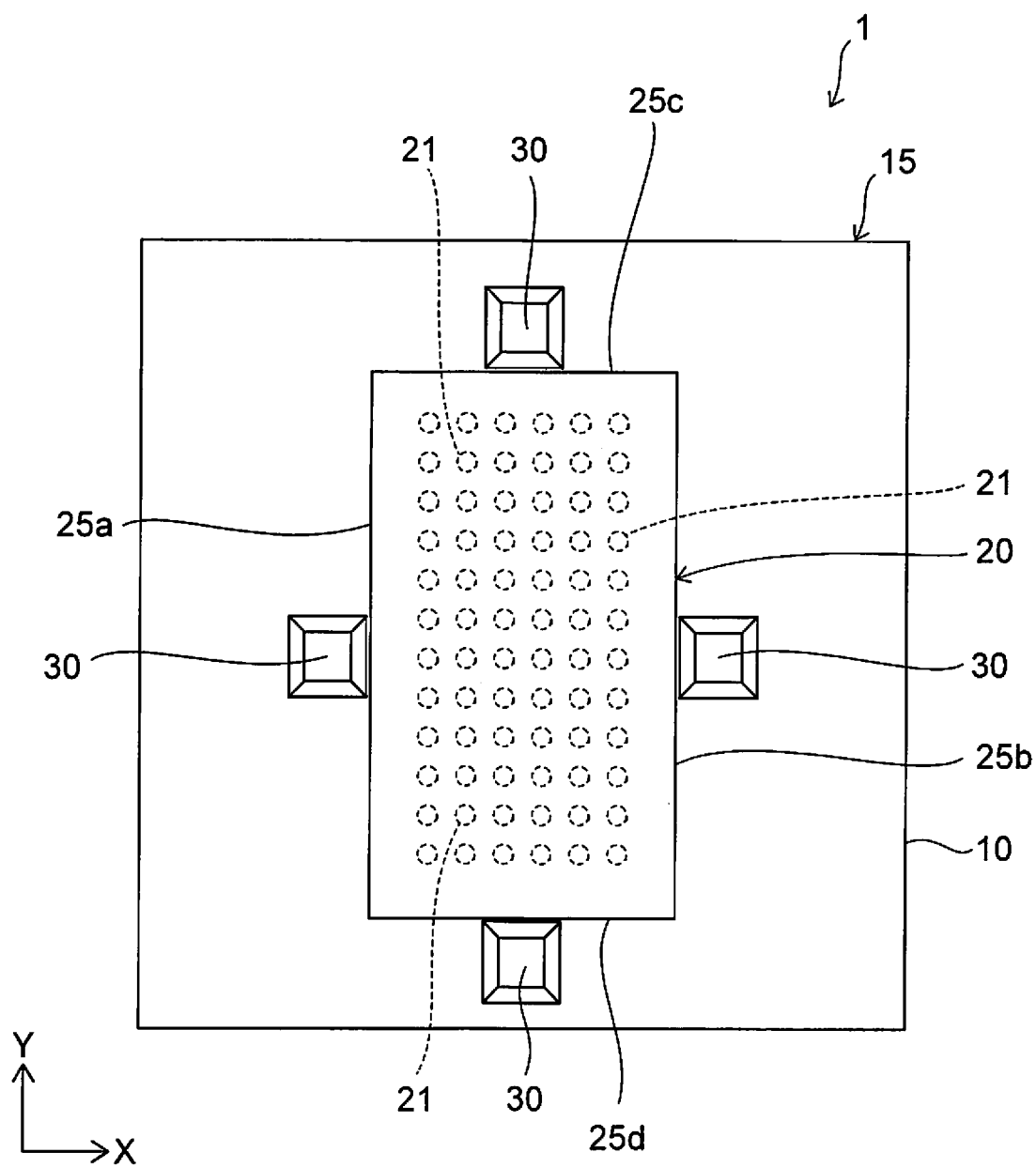
FIG. 6 to FIG. 8 are schematic plan views of the electronic component module according to the embodiment.

As shown in FIG. 6, there may be one positioning component 30 facing the side surface 25*a* of the electronic component 20; and there may be one positioning component 30 facing the side surface 25*b*.

However, as shown in FIG. 1, by providing two positioning components 30 at the vicinities of two extension-direction ends of the side surfaces 25*a* and 25*b* at the long sides, the misalignment amount of the electronic component 20 due to rotation in the XY plane is reduced easily.

Thus, according to the embodiment, by using the positioning components 30 which are compact and have a simple configuration, the electronic component 20 can be positioned accurately on the substrate 10 without using a component such as a socket, etc. Thereby, the cost can be reduced; and a highly-reliable connection is possible even for a narrower pitch of the multiple opposing electrodes 21 of the electronic component 20.

The structure that fixes the positioning component 30 to the metal pad 12 is not limited to the solder 40; for example, a bonding material such as silver paste, etc., may be used. However, by using the solder 40, the positioning component 30 can be positioned easily and accurately to the metal pad 12 by the self-alignment effect due to the surface tension when melting the solder 40.

There is a tendency for the solder 40 to jut slightly outside the edge of the metal pad 12 due to the melting. When the jutting amount of the solder 40 is large, the insertion of the electronic component 20 is impeded by the electronic component 20 colliding with the solder when the electronic component 20 is mounted to the surface of the substrate 10. Because the jutting amount of the solder 40 is proportional to the size (the length of the side) of the metal pad 12, the solder 40 can be prevented from jutting outside the positioning component 30 by setting the size of the metal pad 12 to be smaller than the size of the metal film 35 provided at the lower surface of the positioning component 30.

In FIG. 1, the misalignment of the electronic component 20 in the first direction X can be the total value (the total value of the spacing in the first direction X) of the spacing between the side surface 25*a* of the electronic component 20 and the positioning component 30 facing the side surface 25*a* and the spacing between the side surface 25*b* of the electronic component 20 and the positioning component 30 facing the side surface 25*b*. However, the total value of the spacing in the first direction X is shorter than the width in the first direction X of the opposing electrode 21 (or the electrode pad 11 electrically connected to the opposing electrode 21) and shorter than the minimum distance between the opposing electrodes 21 (or the electrode pads 11) next to each other in the first direction X; therefore, even when the electronic component 20 shifts in the first direction X by the amount of the total value of the spacing in the first direction X, the connection state between the opposing electrodes 21 and the electrode pads 11 to which the opposing electrodes 21 are connected is maintained.

Also, the misalignment of the electronic component 20 in the second direction Y can be the total value (the total value of the spacing in the second direction Y) of the spacing between the side surface 25*c* of the electronic component 20 and the positioning component 30 facing the side surface 25*c* and the spacing between the side surface 25*d* of the electronic component 20 and the positioning component 30 facing the side surface 25*d*. However, the total value of the spacing in the second direction Y is shorter than the width in the second direction Y of the opposing electrode 21 (or the electrode pad 11) and shorter than the minimum distance between the opposing electrodes 21 (or the electrode pads 11) next to each other in the second direction Y; therefore, even when the electronic component 20 shifts in the second direction Y by the amount of the total value of the gaps in the second direction Y, the connection state between the electrodes 21 and the electrode pads 11 to which the electrodes 21 are connected is maintained.

Figure 7:
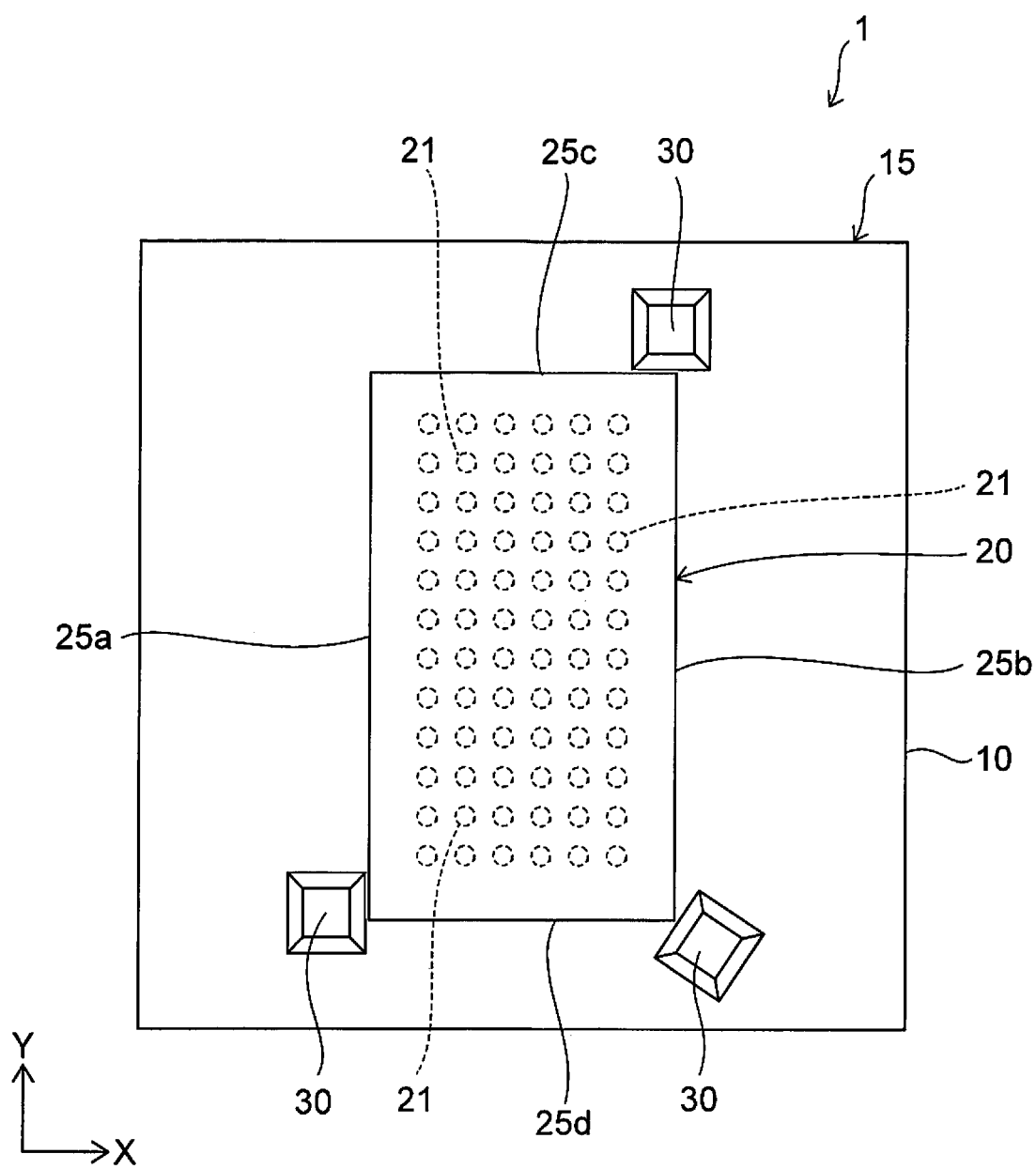

As shown in FIG. 7, if at least three positioning components 30 are provided on the surface of the substrate 10 to have a relationship in which lines connecting the positioning components 30 to each other include a triangle (if the side surfaces of the positioning components 30 face the electronic component 20 at three or more portions), the movement in the first direction X, the movement in the second direction Y, and the rotation on the surface of the substrate 10 can be restricted.

In the example, the positioning component 30 that faces the side surface 25*a* of the electronic component 20 restricts the movement of the electronic component 20 in the left direction of FIG. 7. The positioning component 30 that faces the side surface 25*c* of the electronic component 20 restricts the movement of the electronic component 20 in the upward direction of FIG. 7. The positioning component 30 that faces the corner formed of the side surface 25*b* and the side surface 25*d* of the electronic component 20 restricts the movement of the electronic component 20 in the right direction and the downward direction of FIG. 7. Also, the three positioning components 30 restrict the rotation of the electronic component 20 in the XY plane.

However, compared to the configuration shown in FIG. 7, the misalignment amount of the electronic component 20 can be smaller by providing at least one positioning component 30 facing each of the side surfaces 25*a*, 25*b*, 25*c*, and 25*d* of the electronic component 20 as shown in FIG. 1 and FIG. 6.

Figure 8:
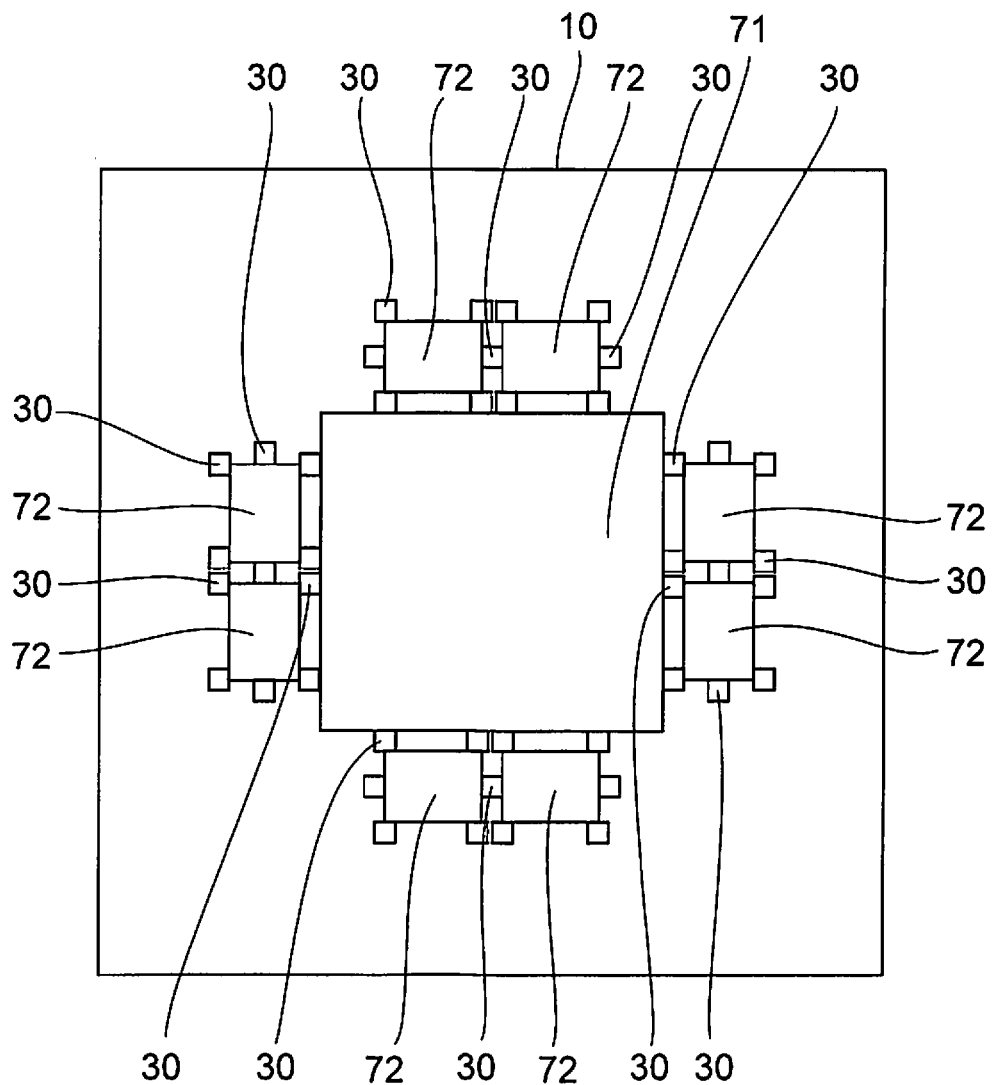

FIG. 8 is a schematic plan view of an electronic component module according to another embodiment.

In the example, one electronic component 71 and multiple electronic components 72 are mounted to the surface of the substrate 10. The electronic component 71 is, for example, a processing device such as a processor, etc. The multiple electronic components 72 are provided at the periphery of the electronic component 71 and include, for example, memory chips.

Similarly to the electronic component 20 described above, for each of the electronic component 71 and the electronic components 72, multiple electrodes are provided at the surface facing the surface of the substrate 10; and the electrodes are electrically connected to the electrode pads 11 provided at the surface of the substrate 10.

The positioning components 30 described above are provided at the peripheries of the electronic component 71 and the electronic components 72; and the electronic component 71 and the electronic components 72 are positioned accurately on the surface of the substrate 10 by the positioning components 30.

The positioning component 30 that is provided between the electronic components 72 next to each other functions as a common positioning component 30 for the electronic components 72 next to each other. Also, the positioning components 30 that are provided between the electronic component 71 and the electronic component 72 function as common positioning components 30 for the electronic component 71 and the electronic components 72.

Figure 9:
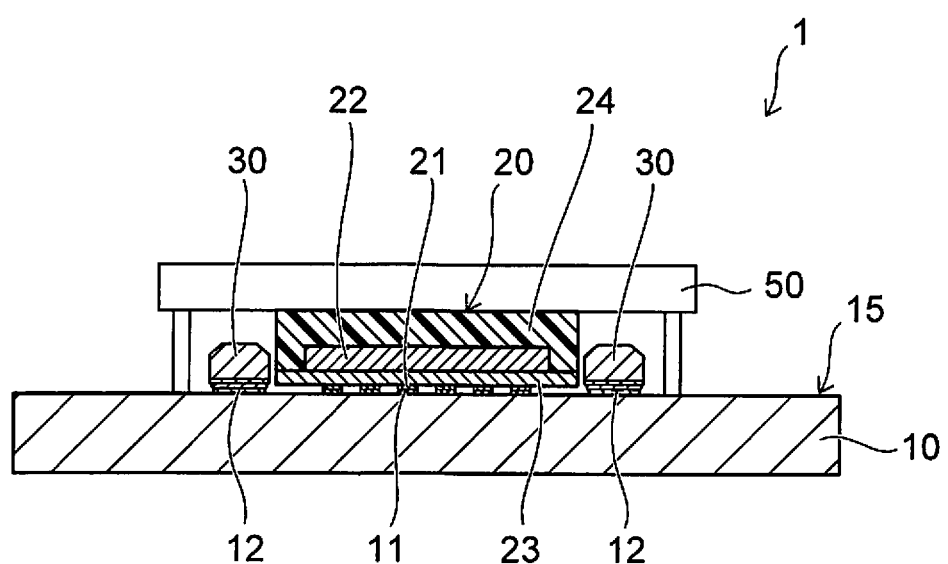
FIG. 9 is a schematic cross-sectional view of the electronic component module according to the embodiment.

The opposing electrodes 21 of the electronic component 20 may be in direct contact with the electrode pads 11. In such a case, as shown in FIG. 9, a reliable electrical connection between the opposing electrodes 21 of the electronic component 20 and the electrode pads 11 is maintained by the electronic component 20 being pressed toward the surface of the substrate 10 by a pressing member 50. For example, the pressing member 50 is fixed to the substrate 10 by screws; and the pressure is generated by the fastening force of the screws.

Or, in a configuration that uses the pressing member 50, the anisotropic conductive member that is inserted between the opposing electrodes 21 and the electrode pads 11 may include multiple conductive core wires piercing the upper and lower surfaces of an insulating member and formed obliquely with respect to the electrical connection direction (the pressing direction).

Figure 10:
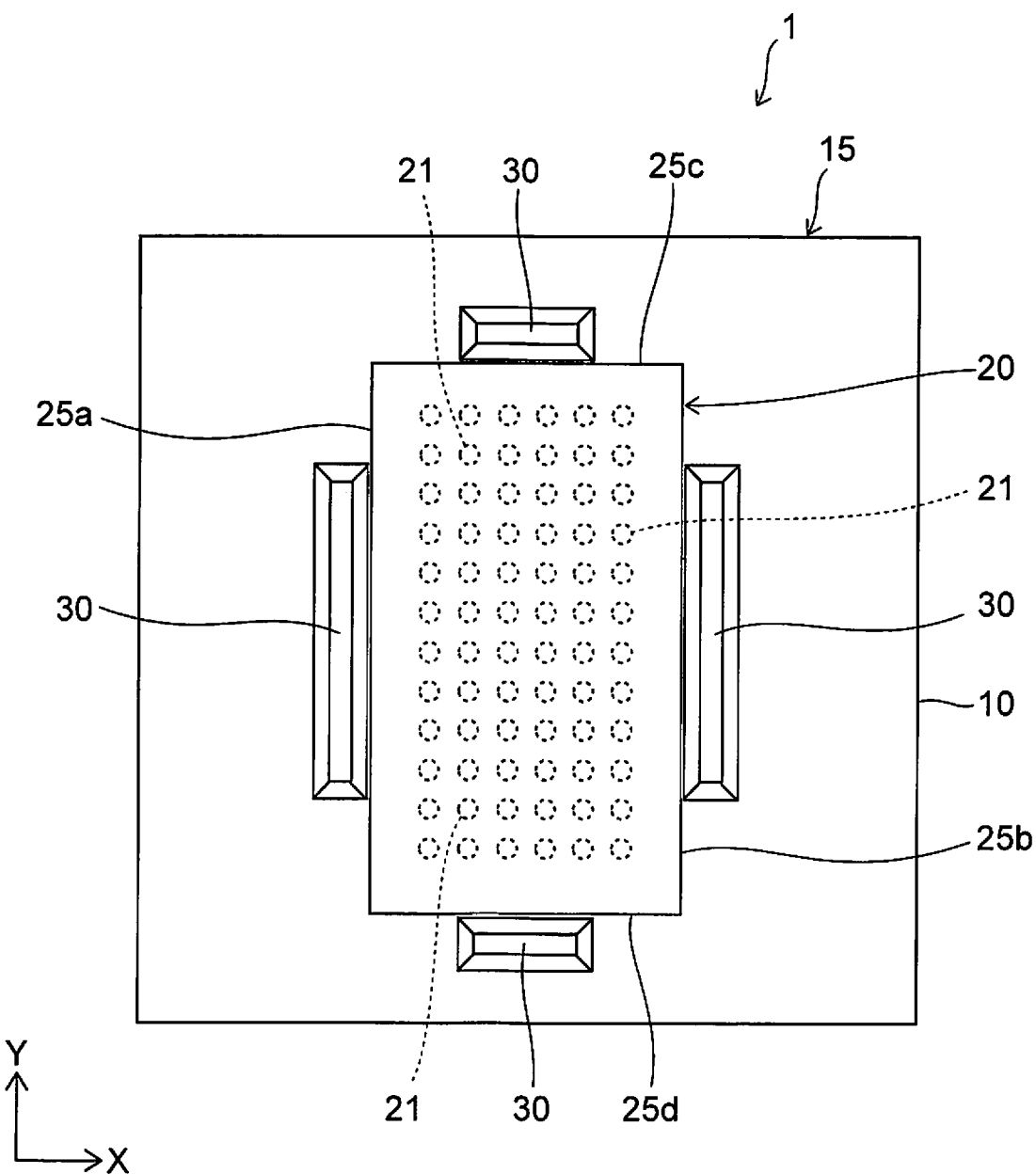
FIG. 10 and FIG. 11 are schematic plan views of a substrate module according to the embodiment.

As shown in FIG. 10, the exterior forms of the positioning components 30 may be rectangles which are long in directions along the side surfaces 25a, 25b, 25c, and 25d of the electronic component 20. In such a case, the exterior forms of the metal pads 12 to which the positioning components 30 are fixed also are rectangular to match the positioning components 30.

Figure 11:
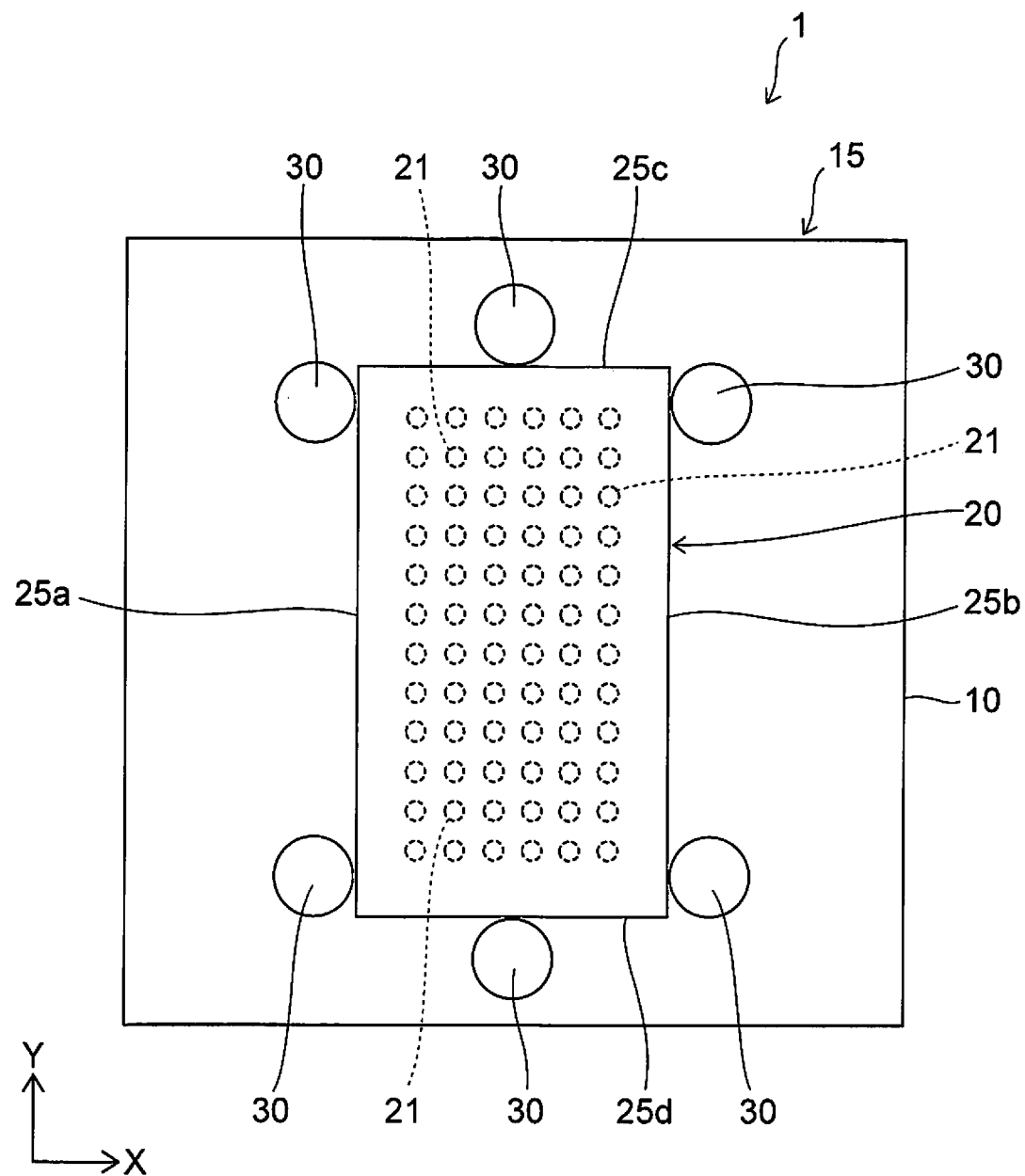

As shown in FIG. 11, the exterior forms of the positioning components 30 may be circular. In such a case, the exterior forms of the metal pads 12 to which the positioning components 30 are fixed also are circular to match the positioning component 30.

Figure 12A:
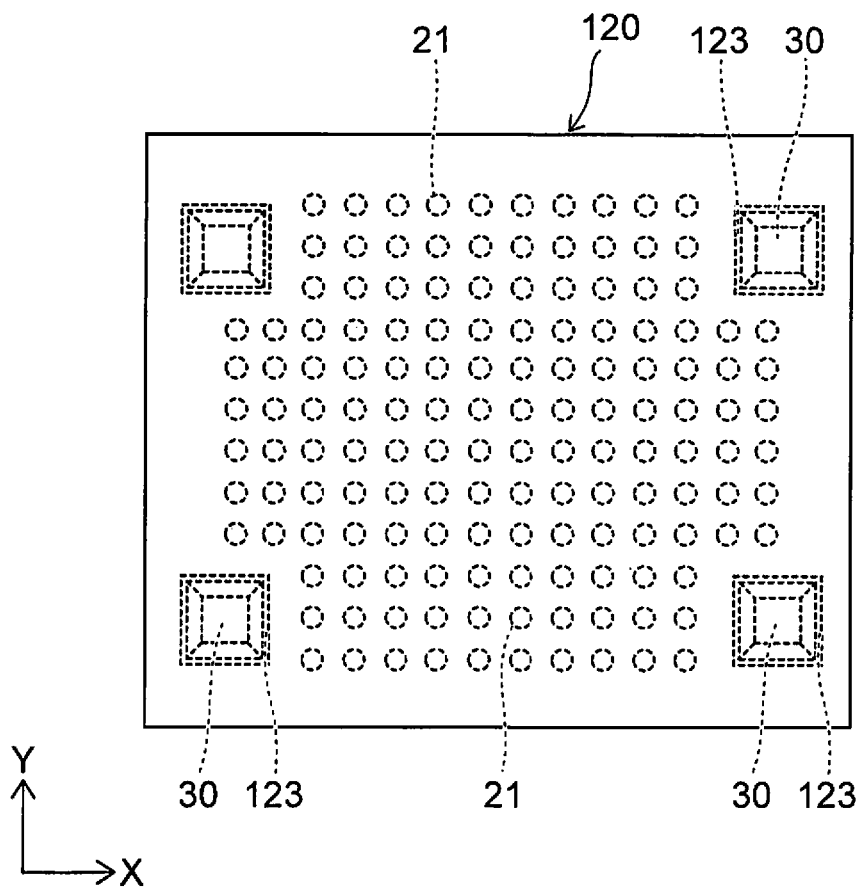
FIG. 12A is a schematic plan view of the electronic component module according to the embodiment.
Figure 12B:
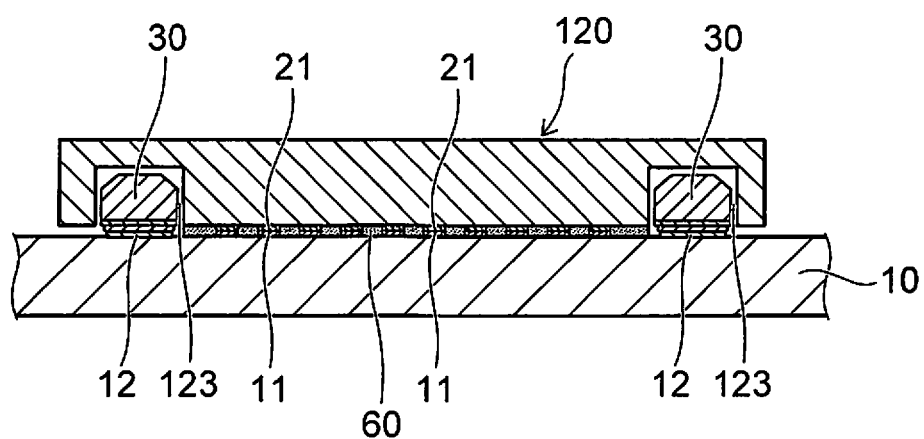
FIG. 12B is a schematic cross-sectional view of the electronic component module shown in FIG. 12A.

FIG. 12A is a schematic plan view of an electronic component module according to another embodiment; and FIG. 12B is a schematic cross-sectional view of the electronic component module shown in FIG. 12A.

In the example as well, the multiple opposing electrodes 21 are formed at the surface of an electronic component 120 opposing the surface of the substrate 10; for example, the opposing electrodes 21 are electrically connected via the anisotropic conductive member 60 to the electrode pads 11 formed at the surface of the substrate 10.

In the electronic component 120, for example, multiple recesses 123 are formed in the portions of the resin package portion opposing the surface of the substrate 10. The positioning components 30 are provided inside the recesses 123. Similarly to the embodiments described above, the positioning components 30 are fixed to the metal pads 12 formed at the surface of the substrate 10.

One positioning component 30 has four side surfaces; and one recess 123 in which the one positioning component 30 is provided has four side surfaces (interior wall surfaces). The four side surfaces of the positioning component 30 respectively face the four side surfaces of the recess 123.

The spacing between the side surface of the positioning component 30 and the side surface of the recess 123 in the first direction X is shorter than the minimum distance between the electrode pads 11 next to each other in the first direction X and the width (the diameter) of the electrode pad 11 in the first direction X. The spacing between the side surface of the positioning component 30 and the side surface of the recess 123 in the second direction Y is shorter than the minimum distance between the electrode pads 11 next to each other in the second direction Y and the width (the diameter) of the electrode pad 11 in the second direction Y.

Due to a slight misalignment after mounting the electronic component 20 to the substrate 10, there may exist a side surface of the positioning component 30 that contacts the side surface of the recess 123.

In the embodiment as well, the positioning components 30 restrict the movement (also including the rotation) of the electronic component 20 in directions parallel to the surface of the substrate 10, and position the electronic component 20 accurately on the substrate 10.

In the example shown in FIG. 12A, the movement (also including the rotation) of the electronic component 120 in the directions parallel to the surface of the substrate 10 is restricted by four positioning components 30 provided proximally to the four corners of the electronic component 120 having a quadrilateral exterior form.

Figure 13:
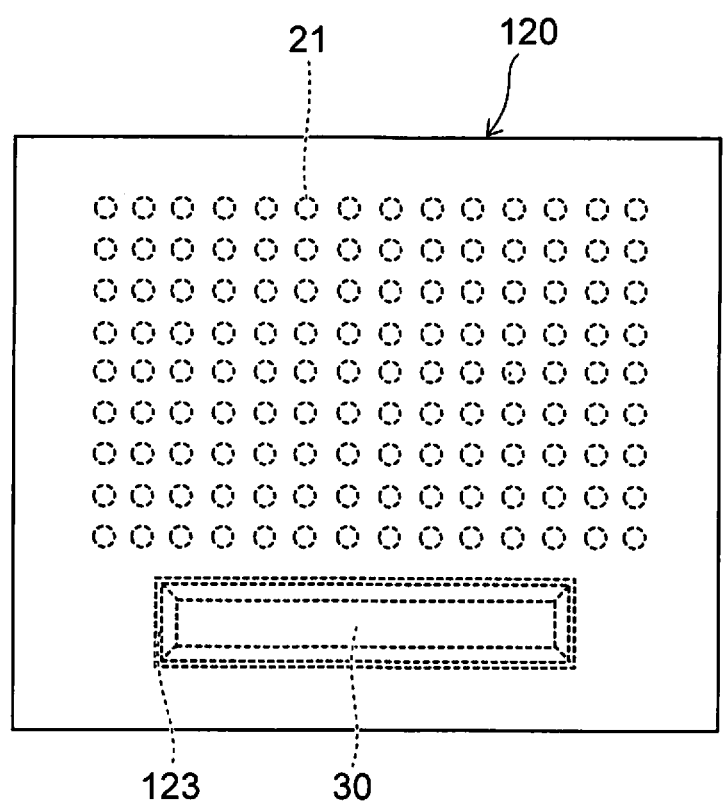
FIGS. 13, 14A, 14B, 15A, and 15B are schematic plan views of the electronic component module according to the embodiment.

Or, as shown in FIG. 13, the movement (also including the rotation) of the electronic component 120 in the directions parallel to the surface of the substrate 10 can be restricted also by forming a rectangular recess 123 along one side of the electronic component 120 and by providing one positioning component 30 having a rectangular exterior form inside the recess 123.

Figure 14A:
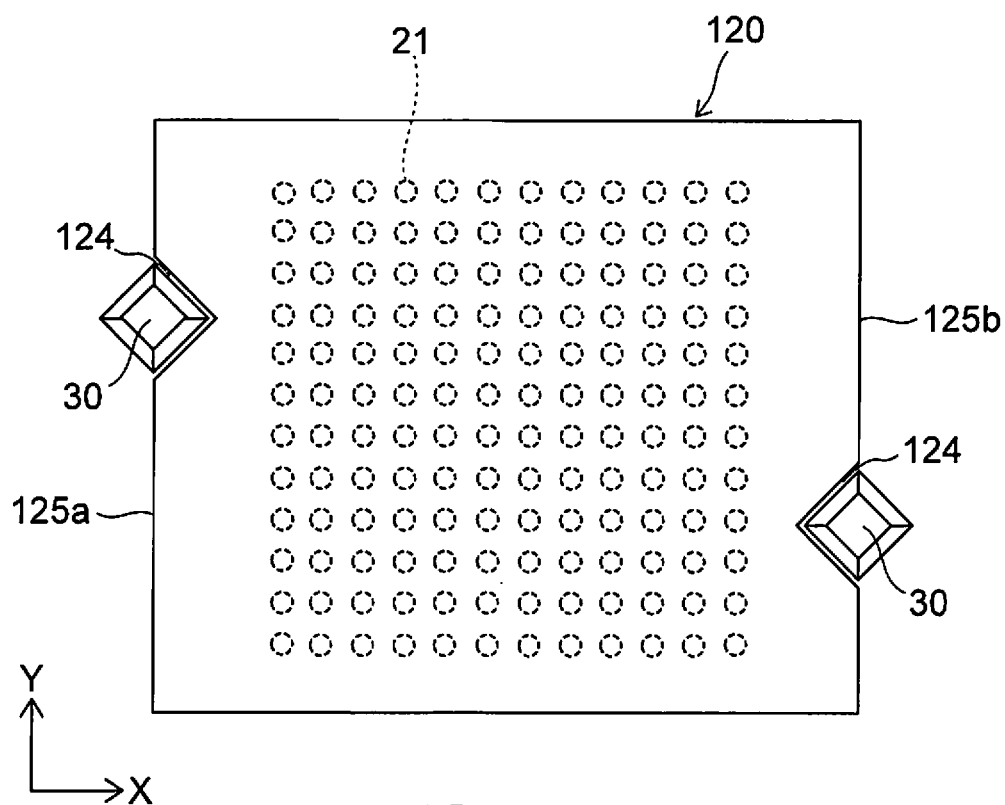

As shown in FIG. 14A, a notch 124 may be formed in the side surface of the electronic component 120; and the positioning component 30 may be provided in the notch 124. For example, the notch 124 and the positioning component 30 are provided in each of the pair of side surfaces 125a and 125b along the same direction of the electronic component 120. For example, one notch 124 has two side surfaces; and the side surfaces of the positioning component 30 face the side surfaces. One notch 124 may have three or more side surfaces. The spacing between the side surface of the positioning component 30 and the side surface of the notch 124 is shorter than the minimum distance between the electrode pads 11 next to each other and shorter than the minimum width of the electrode pad 11.

Figure 14B:
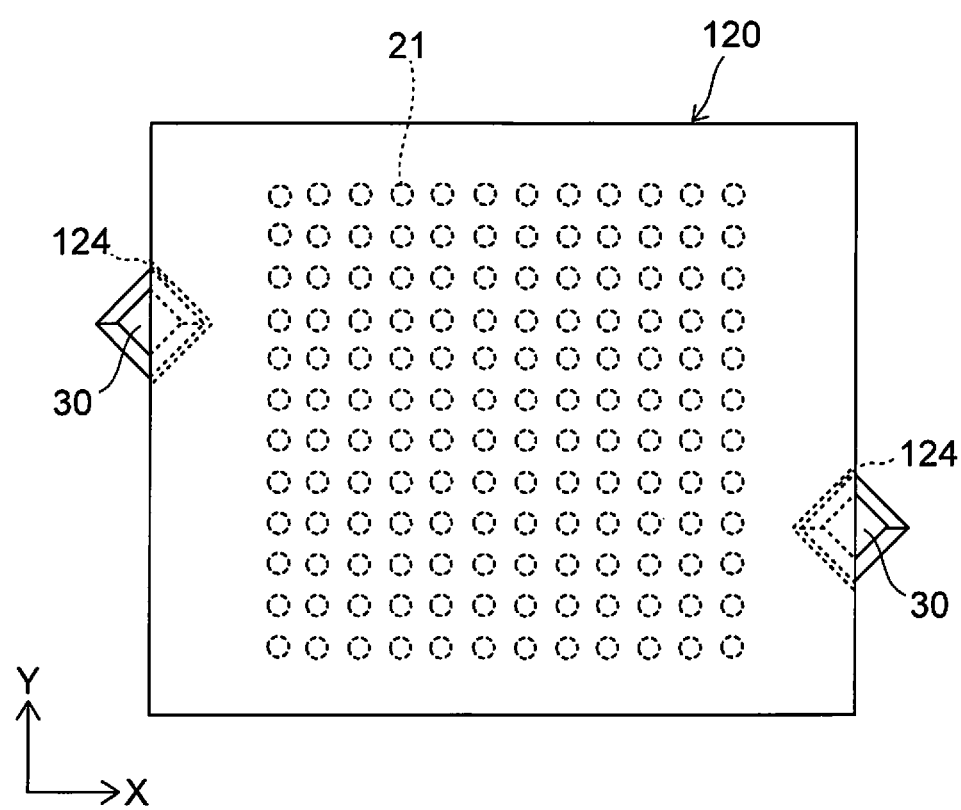

The notch 124 may not always extend to the upper surface of the electronic component 120, and may be formed only in a lower portion in the thickness direction of the electronic component 120 as shown in FIG. 14B.

Figure 15A:
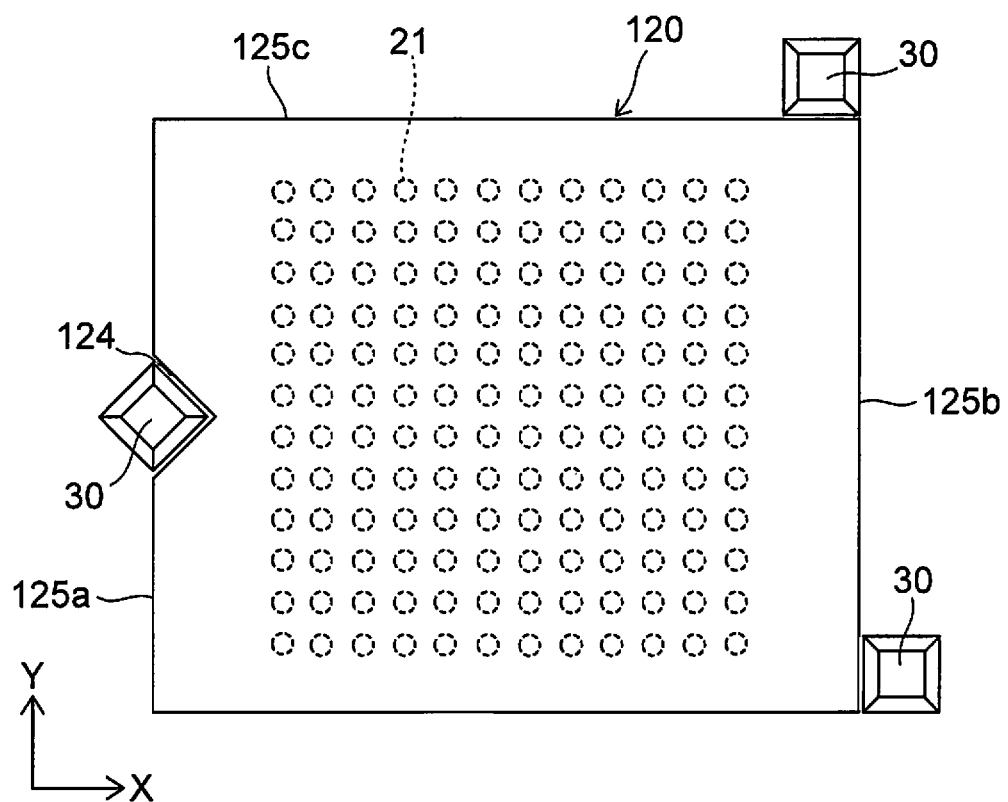

FIG. 15A shows an example in which the electronic component 120 is positioned using the three positioning components 30 including the positioning component 30 provided in the notch 124 formed in the side surface 125a along the second direction Y of the electronic component 120, the positioning component 30 facing the other side surface 125b along the second direction Y, and the positioning component 30 facing a side surface 125c along the first direction X.

Figure 15B:
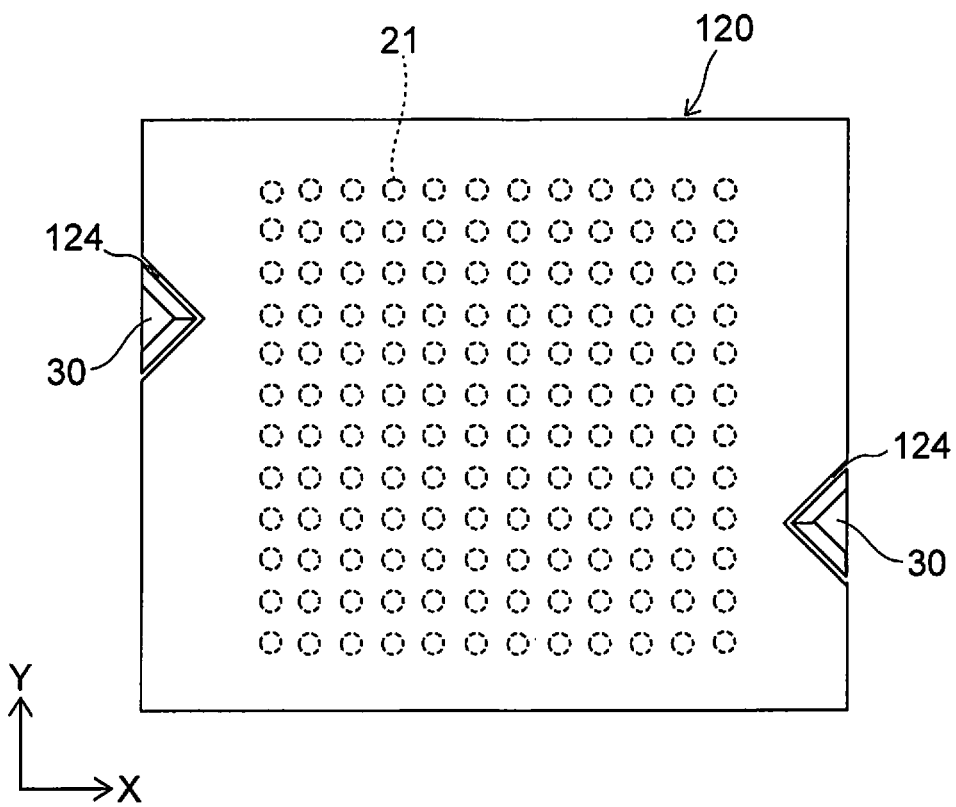

As shown in FIG. 15B, the exterior form of the positioning component 30 may be triangular. Or, the exterior form of the positioning component 30 may be a polygon having five or more sides.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An electronic component module, comprising:
 a substrate;
 a plurality of electrode pads provided at a surface of the substrate;
 at least one metal pad provided at the surface of the substrate;

an electronic component mounted to the surface of the substrate, the electronic component including a plurality of opposing electrodes, the plurality of opposing electrodes opposing the plurality of electrode pads in a direction toward the surface direction and being electrically connected to the plurality of electrode pads; and at least one positioning component fixed to the metal pad with a bonding material different from a material of the positioning component, a gap between the positioning component and the electronic component in an in-plane direction of the surface of the substrate being shorter than a minimum distance of the plurality of electrode pads.

2. The module according to claim 1, wherein
the bonding material includes a solder,
a metal film is provided at a surface of the positioning component facing the metal pad, and
the positioning component is fixed to the metal pad by the solder.

3. The module according to claim 1, wherein the electrode pad and the metal pad are of the same material and have the same thickness.

4. The module according to claim 3, wherein the metal pad has an isolated pattern provided at the surface of the substrate, or the metal pad is limited to an opening in a solder resist.

5. The module according to claim 1, wherein the positioning component has a side surface, an upper surface, and an oblique surface, the side surface facing the electronic component, the oblique surface being provided between the side surface and the upper surface, and being oblique to the side surface and the upper surface.

6. The module according to claim 1, wherein a side surface of the positioning component faces the electronic component at three or more portions.

7. The module according to claim 1, further comprising an anisotropic conductive member electrically connecting the plurality of opposing electrodes of the electronic component and the plurality of electrode pads, and being provided between the plurality of opposing electrodes and the plurality of electrode pads.

8. The module according to claim 1, further comprising a pressing member pressing the electronic component toward the surface of the substrate.

9. An electronic component module, comprising:
a substrate;
a plurality of electrode pads provided at a surface of the substrate;
at least three metal pads provided at the surface of the substrate, an arrangement relationship of the at least three metal pads at the surface of the substrate causing lines connecting the at least three metal pads to each other to include a triangle;

an electronic component mounted to the surface of the substrate, the electronic component including a plurality of opposing electrodes, the plurality of opposing electrodes opposing the plurality of electrode pads in a direction toward the surface direction and being electrically connected to the plurality of electrode pads; and at least three positioning components fixed to the metal pads with a bonding material different from a material of the positioning component, a gap between the positioning component and the electronic component in an in-plane direction of the surface of the substrate being shorter than a minimum distance of the plurality of electrode pads.

10. The module according to claim 9, wherein a side surface of the positioning component faces the electronic component at three or more portions.

11. The module according to claim 9, further comprising an anisotropic conductive member electrically connecting the plurality of opposing electrodes of the electronic component and the plurality of electrode pads, and being provided between the plurality of opposing electrodes and the plurality of electrode pads.

12. The module according to claim 9, further comprising a pressing member pressing the electronic component toward the surface of the substrate.

13. The module according to claim 1, wherein
the bonding material includes a silver paste,
a metal film is provided at a surface of the positioning component facing the metal pad, and
the positioning component is fixed to the metal pad by the silver paste.

14. The module according to claim 1, wherein a material of the positioning component includes a ceramic.

15. The module according to claim 1, wherein a material of the positioning component includes silicon.

16. The module according to claim 1, wherein a material of the positioning component includes glass.

17. The module according to claim 9, wherein a material of the positioning component includes a ceramic.

18. The module according to claim 9, wherein a material of the positioning component includes silicon.

19. The module according to claim 9, wherein a material of the positioning component includes glass.

20. The module according to claim 1, wherein
the bonding material includes a solder,
a metal film is provided at a surface of the positioning component facing the metal pad, and
the positioning component is fixed to the metal pad by the solder.

* * * * *